United States Patent [19]
Pittman et al.

[11] Patent Number: 4,937,874
[45] Date of Patent: Jun. 26, 1990

[54] EMULATED GUITAR LOUDSPEAKER

[76] Inventors: R. Aspen Pittman, P.O. Box 923353, Sylmar, Calif. 91342; Marshall D. Buck, 322L Provon La., Los Angeles, Calif. 90034

[21] Appl. No.: 378,575

[22] PCT Filed: Jul. 2, 1986

[86] PCT No.: PCT/US86/01425
§ 371 Date: Jan. 3, 1989
§ 102(e) Date: Jan. 3, 1989

[87] PCT Pub. No.: WO88/00410
PCT Pub. Date: Jan. 14, 1988

[51] Int. Cl.$^5$ .............................................. H03G 3/00
[52] U.S. Cl. ........................................ 381/61; 381/98; 381/111; 381/117; 381/118; 381/120
[58] Field of Search ................ 381/61, 59, 98, 111, 381/117, 118, 120

[56] References Cited

U.S. PATENT DOCUMENTS

| | | | |
|---|---|---|---|
| 3,860,876 | 1/1975 | Woods | 328/167 |
| 4,584,700 | 4/1986 | Scholz | 381/61 |
| 4,683,589 | 7/1987 | Scholz et al. | 381/61 |
| 4,752,960 | 6/1988 | Scholz | 381/61 |
| 4,809,336 | 2/1989 | Pritchard | 381/61 |

OTHER PUBLICATIONS

Rockotron "Power Play Circuit" (undated).
R. Small: Direct-Radiator Loudspeaker System Analysis; IEEE Transaction on Audio and Electroacoustics (Dec. 1971), pp. 269-281.
Letter from E. Aspen Pittman to James Waller dated 3-22-89.
F. Langford-Smith, ed.; Radiotron Designer's Handbook; Wireless Press Australia (1953), pp. 837-838.

*Primary Examiner*—Forester W. Isen
*Attorney, Agent, or Firm*—Christie, Parker & Hale

[57] ABSTRACT

Circuitry is provided for simulating and emulating the sounds of a loudspeaker driven by a classic rock and roll guitar amplifier in the form of an electrical signal which, when input to a recording console or used to drive high fidelity headphones or a high quality monitor amplifier and monitor loudspeaker, accurately reproduces such sounds. The circuitry is incorporated at the output of a classic tube-type rock and roll guitar amplifier, and consists of three basic modules: a load impedance module (FIG. 3) designed to offer to the tube amplifier output a load impedance as a function of frequency (FIG. 1) which is modeled after and nearly identical (in both real and imaginary components) to the impedance of a classic rock and roll guitar speaker; a highpass filter circuit (24) which emulates the low frequency resonance and rolloff characteristics (FIG. 7) of a classic rock and roll open-back guitar speaker cabinet; and further filtering circuits (26, 30, 32, 34, 36, 40) which emulate the mid and high frequency characteristics (FIG. 7) of a classic rock and roll guitar loudspeaker. Electrical outputs (50) are provided for driving a recording mixer, headphones, a speaker, and an external power amplifier.

7 Claims, 3 Drawing Sheets

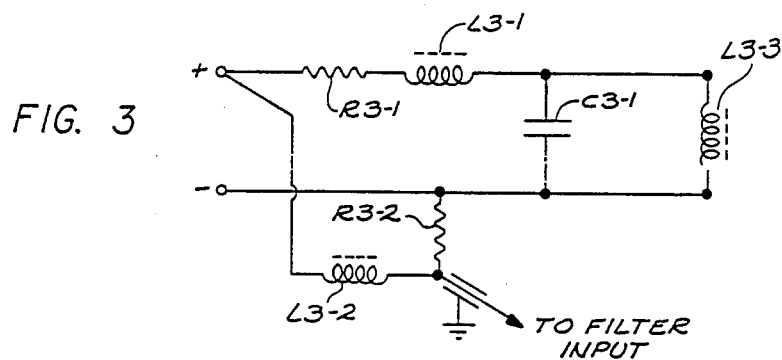
FIG. 3
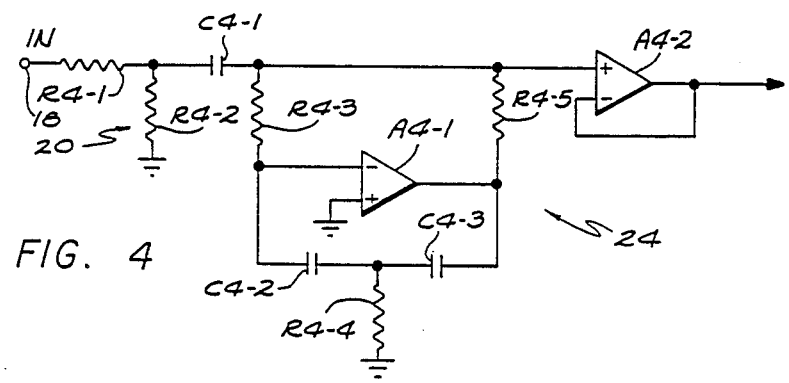
FIG. 4
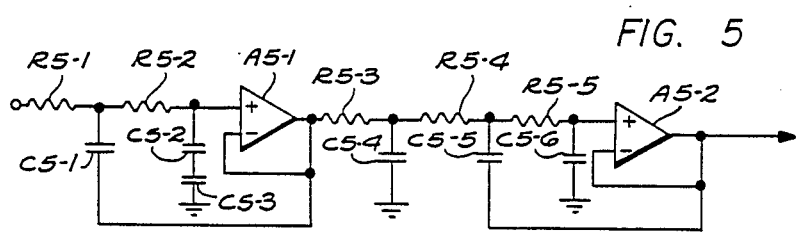
FIG. 5
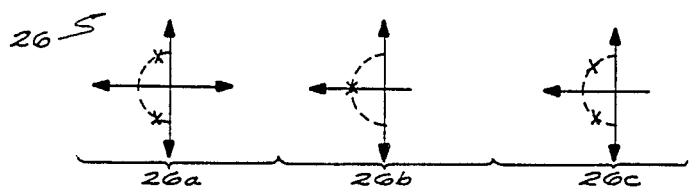

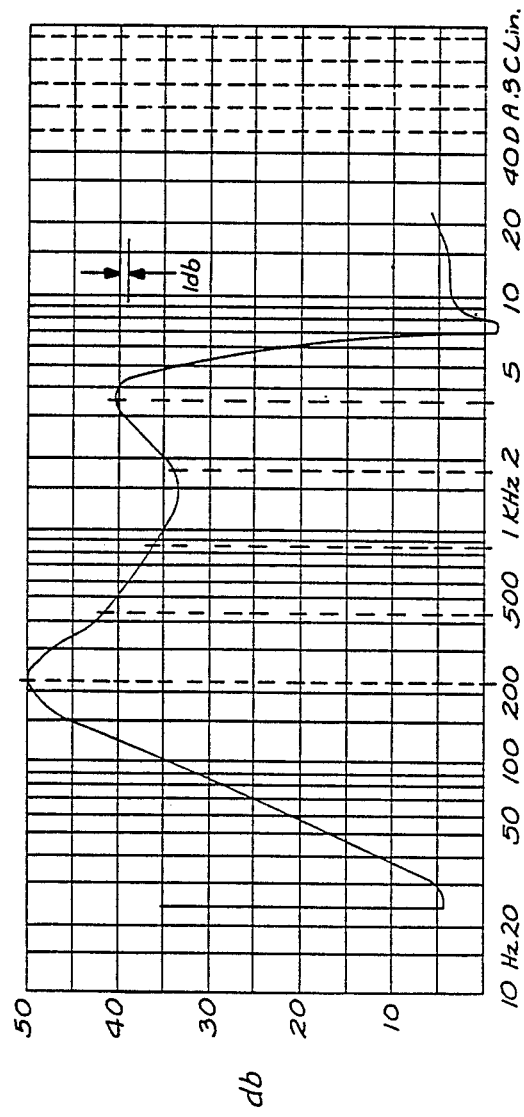
FIG. 7
FIG. 6
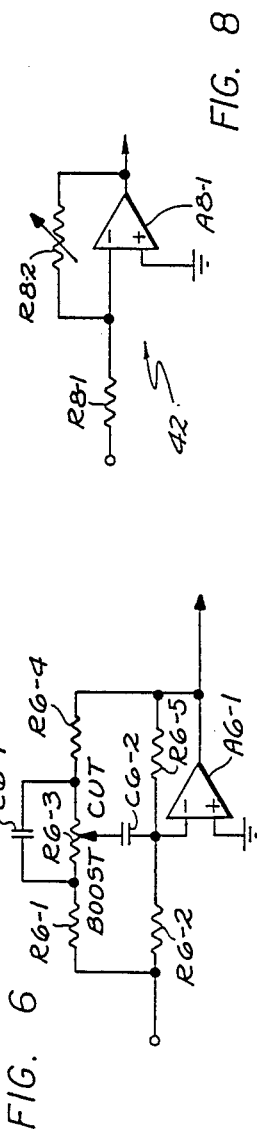
FIG. 8

EMULATED GUITAR LOUDSPEAKER

TECHNICAL FIELD

This invention relates to electrical signal conditioning apparatus for use with electric guitars and tube type guitar amplifiers to produce an electrical output signal having predetermined tone, timbre and/or distortion characteristics.

BACKGROUND ART

The sound of a guitar playing through a classic 1960's Fender or Marshall vacuum tube amplifier and speaker, such as a Celestion 12 inch model G12, becomes identified with Rock and Roll music, and in essence defined a new form of musical instrument. Rather than simply a means for providing increased loudness for entertaining large audiences, those "classic" rock and roll guitar vacuum tube amplifiers and associated output transducers provided a reedlike sound when driven into overload which could be finely controlled and shaded into a variety of musical textures by the skilled guitarist. Various attempts have been made over the past twenty years to simulate that highly desirable reedlike sound by means of transistorized amplifiers driving speakers or driving resistors, or by means of vacuum tube amplifiers driving resistors.

Laub, in U.S. Pat. No. 3,835,409 teaches a solid state amplifier which includes means for generating large amounts of crossover distortion in proportion to the amplitude of the signal. Moog, in U.S. Pat. No. 4,180,707, teaches a variety of solid state circuits which can create even or odd order distortion to simulate some of the effects of overdriven vacuum tubes. Smith, in U.S. Pat. No. 4,211,893 teaches an electronic amplifying apparatus which is intended to simulate the distortions of vacuum tubes by the use of either FETs or bipolar transistors. Sondermeyer, in U.S. Pat. No. 4,405,832 teaches a distortion circuit consisting primarily of a diode clipper and a potentiometer incorporated in an operational amplifier circuit. An article by T. E. Rutt entitled "Vacuum Tube Triode Nonlinearity as part of the Electric Guitar Sound." which was published as Audio Engineering Society Preprint 2141, October 1984 discloses that the distinctive distortion of a tube amplifier is caused by grid current effects which have never been successfully duplicated by semiconductor circuits. Scholtz has sold a commercial product under the brand name Power Soak which resistively loaded a guitar amplifier and provided for an adjustable portion of the electrical output signal which can then be applied to headphones, a speaker, or a recording console; this allows an amplifier to be driven into overload safely while not having to produce loud sounds in air.

All of these prior art devices and inventions have shortcomings which prevent them from providing all of the touch and sound of the classic tube-type guitar amplifier/speaker/cabinet combination as an electrical signal which can be fed directly into a conventional recording console and/or transduced into musical sounds in air by conventional linear means.

Another prior art method which can under certain circumstances provide all of the touch and sound of the classic tube-type guitar amplifier/speaker/cabinet combination as an electrical signal was to place a microphone in front of a conventional loudspeaker contained in a classic small tube type Fender, Vox, or Marshall amp, and then use the microphone to transduce the musical sounds from the loudspeaker into electrical signals which can then be further amplified, recorded, and again transduced into sounds in air either at a later time or at a higher amplitude. That technique required that loud performance level sounds to be generated in air, was susceptible to undesirable feedback in a real-time reinforcement situation, and was subject to undesirable variations in sound quality as a function of microphone type, placement, and the room in which the instrument is placed. It is also susceptible to contamination by outside sounds and noises.

DISCLOSURE OF THE INVENTION

It is accordingly an object of the present invention to overcome the deficiencies of the prior art and to provide a signal conditioning circuit which can generate an electrical output signal which when linearly amplified and transduced into sounds in air will emulate the tone and timbre and touch of a classic guitar amplifier such as a 1960's Fender amp containing a classic guitar speaker such as the Celestion G12. In accordance with various specific aspects of the invention, such an electrical output signal may be used as input to a recording console or public address reinforcement system, or as a signal for driving headphones.

It is a further object of another specific aspect of the invention to so arrange the circuitry that a moderately powerful signal is also available to drive a speaker, while still providing the above described electrical output signal for driving a recording console or reinforcement system.

The present invention accordingly provides a circuit for loading the output of a classic tube type guitar amplifier of moderate power capacity with the complex impedance of a loudspeaker in a typical cabinet, for emulating the frequency response of a guitar loudspeaker in a cabinet, and for providing an electrical output signal which when linearly transduced into sounds in air properly and suitably emulates the tone, timbre, and touch of a desirable classic 1960's Fender or Marshall guitar amplifier/speaker/cabinet combination, thus allowing a musician to express his artistic will and desires, using his motor skills in conjunction with his perception of the sounds produced by the invention in combination with either headphones or a loudspeaker.

BRIEF DESCRIPTION OF DRAWINGS

The foregoing and other objects, features, and advantages of the invention will become more readily apparent upon reference to the following detailed description of a presently preferred embodiment, when taken in conjunction with the accompanying drawings in which like numbers refer to like parts, and in which

FIG. 3 is a schematic diagram of a preferred embodiment of the load circuitry and an initial passive low pass filter section.

FIG. 4 is a schematic diagram of a 30 dB pad and 100 Hertz highpass filter.

FIG. 5 is a schematic diagram of a five-pole lowpass 4500 Hertz Butterworth filter.

FIG. 6 is a schematic diagram of a representative bandpass section.

FIG. 7 shows the overall frequency response of the filter circuitry when properly adjusted.

FIG. 8 is a schematic diagram of the inverting buffer stage which provides final gain adjustment and line and headphone driving capability.

BEST MODE FOR CARRYING OUT THE INVENTION

Figure 1:
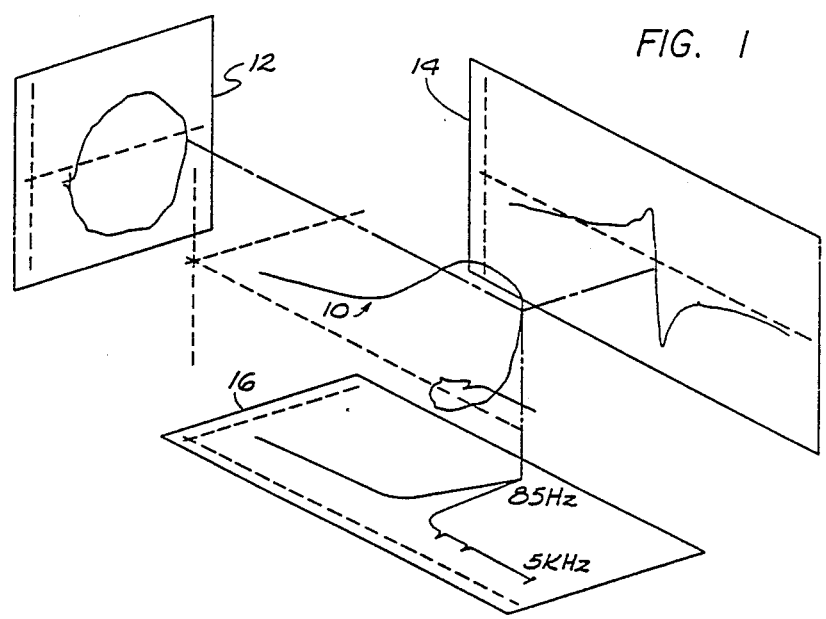
FIG. 1 shows the impedance function, plotted as a generalized Heyser spiral, of the amplifier load module.

Particular reference should now be made to FIG. 1 which shows the complex impedance function, plotted as a generalized Heyser spiral 10 projected onto three orthogonal planes 12, 14, 16, of an amplifier load module contemplated by a preferred embodiment of the present invention, and to FIG. 3, which is a schematic diagram of that load circuitry operatively connected to an initial passive low pass filter section. The resistor R3-1 is a 10 Ohm, 25 watt unit which can dissipate the full output of the classic tube type transformer coupled guitar amplifier (not shown) which is connected in normal use to the load module's input terminals "+" and "−". Coil L3-1 is 0.9 mH and simulates the voicecoil inductance of a loudspeaker. 14 mH Coil L3-3 and 200 uF Capacitor C3-1 constitute a parallel resonant circuit which simulates the fundamental resonance of a conventional "classic" rock and roll electric guitar amplifier loudspeaker having the Q and center frequency which are typically associated with such loudspeakers. The thus far-described portion of the load circuit is preferably connected through a so-called "normal" jack (not shown) to the remainder of the circuitry so that in the absence of a loudspeaker load plugged into the jack, the circuit properly loads the amplifier to allow it to operate in its usual range of distortion and output level. As will be readily apparent to the skilled artisan, if a loudspeaker having the appropriate voice coil inductance and fundamental resonance characteristics is connected to the output of the guitar amplifier, this portion of the circuitry is no longer required and by virtual of the above described construction employing a normal jack or other equivalent connection means, it may be conveniently disconnected. In any event, with either a real or simulated load, the signal from the output of the guitar amp is preferably led through 0.9 mH coil L3-2 terminated by 22 Ohm resistor R3-2 to provide an initial low pass filter stage which then passes the signal to the filter portion of the present invention, a presently preferred embodiment of that filter section being shown in block diagram form in FIG. 2 and in more detailed schematical diagram form in FIGS. 4, 5, 6 and 8 and having the frequency response characteristics set forth in FIG. 7.

Figure 2:
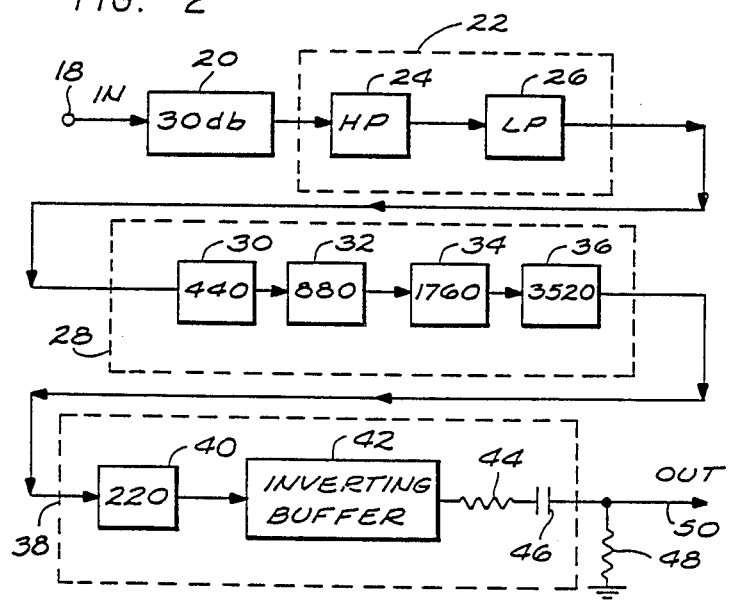
FIG. 2 is a system block diagram of the filter circuitry which emulates the transfer function of a loudspeaker.

Referring now to FIGS. 2 and 4, it will be seen that the loaded amplifier output is applied, by means of "IN" terminal 18, to a 30 db attenuator pad 20 which is of conventional construction and which comprises series resistor R4-1 and shunt resistor R4-2. The attenuator 20 serves to reduce the 50 volt peak spikes which can be generated in full overdrive conditions to levels which will not clip or distort in even the highest gain stages of the filter stages to follow. The first active filter stage is a conventional 3-pole Butterworth 100 Hz highpass active filter 24 which simulates the low frequency rolloff response of the loudspeaker and cabinet (refer also to the left hand portion of the overall preferred response curve set out in FIG. 7) and which comprises 0.1 uF capacitors C4-1, C4-2, and C4-3; 15k resistors R4-3, R4-4 and R4-5, and operational amplifier A4-1, so as to similarly rolloff the same lower frequencies of the input to isolating operational amplifier A4-2 which is provided between the highpass filter 20 and the lowpass filter 26 to prevent any output impedance interaction between the highpass filter 20 and any subsequent stages.

Lowpass filter 26 (see also FIG. 5.) is a conventional five pole Butterworth lowpass 4500 Hz filter which simulates the quick high frequency rolloff of a guitar loudspeaker (refer also to the right hand portion of the overall preferred response curve set out in FIG. 7). As shown in FIG. 5, lowpass filter 26 comprises an active first stage 26a including a 36k resistor R5-1, a 6.8k resistor R5-2, and capacitors C5-1, C5-2 and C5-3 having respective values of 0.01 uF, 0.001 uF and 0.001 uF (the latter two connected in series), in combination with a first operational amplifier A5-1, followed by a passive stage 26b comprising a 3.6k resistor and a 0.01 uF capacitor C5-4, which in turn is followed by an active third stage 26c comprising a 56k resistor R5-4, a 2.2K resistor R5-5, a 0.01 capacitor C5-5 and a 0.001 uF capacitor C5-6, in combination with a second operational amplifier A5-2.

Butterworth filters are preferred because of their minimal phase error characteristics. Since the sharpness of a Butterworth filter is related to the number of "poles" (reactive elements), a five pole Butterworth is preferred for lowpass filter 26 since it has been determined that a minimum of five poles provide the desired relatively quick rolloff associated with a "classic" guitar loudspeaker. However, other types of filters having other numbers of poles may be substituted, provided they have highpass and lowpass rolloff characteristics comparable to the particular loudspeaker/cabinet combination thjat is to be emulated.

The lowpass filter is then followed by a series of five adjustable bandpass filters 30, 32, 34, 36 and 40 which are preferably adjusted to produce the frequency response of FIG. 7, which was originally generated by measuring the frequency response characteristics of a typical "classic" loudspeaker and loudspeaker cabinet originally intended for use with a tube amplified electric guitar, and has been found to simulate very closely the frequency response of such a guitar loudspeaker.

Reference should now be made to FIG. 6, which shows a typical one of the serially arranged adjustable bandpass filters 30, 32, 34, 36 and 40 and which may each comprise a fixed network of 10k resistors R6-1, R6-4, 100k resistors R6-2 and R6-5 and capacitors C6-1 and C6-2, as well as an adjustable center tapped 500k potentiometer R6-3 and an operational amplifier A6-1. Capacitors C6-1 and C6-2 may have respective nominal values of 0.01 uF and 0.05 uF for filter 40, and may both be 0.01 uF for 440 Hz filter 30, 0.0056 uF for 440 Hz filter 32, 0.0027 uF for filter 34, and 0.0015 uF for filter 36, to provide five respective active bandpass filters respectively centered at 220 Hz, 440 Hz, 880 Hz, 1760 Hz, and 3520 Hz which have respective maximum gain (attenuation) of approximately 16 db for 22 OHz filter 40 and of approximately 11 db for the other four filter stages 30, 32, 34 and 36. The individual potentiometers R6-3 of the five individual bandpass filters are preferably set to provide the respective levels set forth in the central portion of FIG. 7. The bandpass filters are followed by an inverting buffer amplifier 42 (see also FIG. 8) comprising a 10k input series resister R8-1 and adjustable gain resistance R8-2 in combination with operational amplifier A8-1 as well as 47 ohm output series resistance 44 and 5 uF blocking capacitor 46. This provides a buffered, amplified signal having an adjustable level and appropriate output characteristics for connection to a conventional external passive transducer device (not shown) such as headphones, and/or which may be connected to a cable leading to a external recording console and/or other external equipment. (not shown) such as a high powered linear amplifier and conventional concert hall loudspeakers which may then provide high level playback for a large audience. There may also be provided a fixed or variable termination resistance 48 to provide a user controlled output level.

As indicated by the dashed boxes 22, 28 and 38 of FIG. 2, the filter portion of the invention may conveniently be constructed in three individual modules, the first module 22 comprising the highpass filter 24 and the lowpass filter 26, the second module 28 comprising the four upper bandpass filters 30, 32, 34 and 36, and the third module comprising the lower bandpass filter 40, the inverting buffer 42 and the associated output terminal impedance network comprising resistance 44 and capacitor 46.

Thus in accordance with the teachings of the present invention there may be provided an electrical signal faithfully representative of the desired sound of a classic rock and roll guitar amplifier and loudspeaker, without requiring any critical microphone placement, or presenting any possibility of unwanted acoustic feedback.

It should be appreciated that the preceding specification describes a presently preferred embodiment of the invention as an illustration and not a limitation thereof. Equivalent modifications and variations of the invention will doubtless occur to those skilled in the art. Accordingly, the scope of the invention as set forth with greater particularity in the appended claims should be interpreted to encompass all equivalents to which the invention is fairly and legally entitled.

We claim:

1. A circuit for generating a conditioned electrical signal representative of the sound of an electrical guitar comprising input means for receiving the output from a tube-type guitar amplifier, conditioning means comprising a highpass filter, a lowpass filter, and a plurality of adjustable bandpass filters for conditioning said output in accordance with a desired sound characteristic and output means for producing an electrical signal from the conditioned output, wherein:

said desired sound characteristic emulates the sound of a predetermined type of loudspeaker having a given complex impedance in a predetermined type of cabinet driven by a conventional tube-type guitar amplifier, said input means comprises a load impedance portion which simulates the complex impedance of said predetermined loudspeaker in said predetermined cabinet and provides said tube-type amplifier with a simulated load having said complex impedance, said conditioning means filters said output in accordance with the frequency response of said predetermined loudspeaker in said predetermined cabinet, and said conditioning means emulates the intermediate frequency response of said predetermined loudspeaker in said predetermined cabinet.

2. A circuit as set forth in claim 1 further wherein said load impedance portion further comprises a parallel resonant circuit for simulating the fundamental resonance of said predetermined loudspeaker, and a coil for simulating the voice coil inductance of said predetermined loudspeaker.

3. A circuit as set forth in claim 1 further wherein said load impedance portion may be disconnected from the output of said tube type amplifier and replaced with a loudspeaker.

4. A circuit as set forth in claim 1 further wherein said output means is connected to a recording mixer.

5. A circuit as set forth in claim 1 further wherein said output means is connected to a linear amplifier.

6. A circuit as set forth in claim 1 further wherein said output means is connected to headphones.

7. A circuit as set forth in claim 1 further wherein said highpass filter is a Butterworth filter having a relatively slow rolloff characteristic and said lowpass filter is a Butterworth filter comprising at least five poles and having a relatively quick rolloff characteristic.

* * * * *

UNITED STATES PATENT AND TRADEMARK OFFICE
CERTIFICATE OF CORRECTION

PATENT NO. : 4,937,874

DATED : June 26, 1990

INVENTOR(S) : R. Aspen Pittman; Marshall D. Buck

It is certified that error appears in the above-identified patent and that said Letters Patent is hereby corrected as shown below:

Column 1, line 14, change "becomes" to -- became --.
Column 1, line 43, after "Sound" delete the period.

Column 2, line 5, After "sounds" delete "to".

Column 3, line 38, change "virtual" to -- virtue --.

Column 4, line 2, change "filter 20" to -- filter 24 --.
Column 4, line 6, after "5" delete the period.
Column 4, line 34, change "thjat" to -- that --.
Column 4, line 58, change "22 OHz" to -- 220 Hz --.
Column 4, line 65, change "resister" to -- resistor --.

Column 5, line 5, before "external" change "a" to
        -- an --.
Column 5, line 6, after "equipment" delete the period.
Column 5, lines 19,20, change "terminal" to
        -- termination --.

Column 6, line 21, after "Claim 1" delete "further".
Column 6, line 28, after "Claim 1" delete "further".
Column 6, line 31, after "Claim 1" delete "further".
Column 6, line 32, delete "is connected to" and insert
        therefor -- comprises --.
Column 6, line 33, after "Claim 1" delete "further".
Column 6, line 34, delete "is connected to" and insert
        therefor -- comprises --.

UNITED STATES PATENT AND TRADEMARK OFFICE
CERTIFICATE OF CORRECTION

PATENT NO. :     4,937,874

DATED :          June 26, 1990

INVENTOR(S) :    R. Aspen Pittman; Marshall D. Buck

It is certified that error appears in the above-identified patent and that said Letters Patent is hereby corrected as shown below:

```
Column 6, line 36, after "Claim 1" delete "further".
Column 6, line 37, delete "is connected to" and insert
          therefor -- comprises --.
Column 6, line 38, after "Claim 1" delete "further".
```

Signed and Sealed this

Eleventh Day of February, 1992

Attest:

HARRY F. MANBECK, JR.

*Attesting Officer*     *Commissioner of Patents and Trademarks*